US012159979B2

(12) United States Patent
Okuyama et al.

(10) Patent No.: US 12,159,979 B2
(45) Date of Patent: Dec. 3, 2024

(54) TEST JIG, TEST DEVICE, AND TEST METHOD FOR SECONDARY BATTERY

(71) Applicant: ESPEC CORP., Osaka (JP)

(72) Inventors: Arata Okuyama, Osaka (JP); Takashi Kajihara, Osaka (JP)

(73) Assignee: ESPEC CORP., Osaka (JP)

( * ) Notice: Subject to any disclaimer, the term of this patent is extended or adjusted under 35 U.S.C. 154(b) by 0 days.

(21) Appl. No.: 17/485,835

(22) Filed: Sep. 27, 2021

(65) Prior Publication Data

US 2022/0102768 A1 Mar. 31, 2022

(30) Foreign Application Priority Data

Sep. 30, 2020 (JP) .................. 2020-164870

(51) Int. Cl.
*H01M 10/42* (2006.01)
*G01R 31/392* (2019.01)

(52) U.S. Cl.
CPC ...... *H01M 10/4285* (2013.01); *G01R 31/392* (2019.01)

(58) Field of Classification Search
CPC .. H01M 10/4285; H01M 50/20; H01M 10/48; G01N 1/22; G01R 31/392
USPC ................................ 324/425–434
See application file for complete search history.

(56) References Cited

U.S. PATENT DOCUMENTS

| | | | |
|---|---|---|---|
| 2002/0126733 A1* | 9/2002 | Blankenagel | G01K 15/00 374/1 |
| 2012/0134388 A1* | 5/2012 | Sawa | G01K 1/14 374/E7.004 |
| 2017/0059500 A1* | 3/2017 | Honda | H01M 10/488 |
| 2017/0179538 A1* | 6/2017 | Christensen | G01R 31/382 |
| 2018/0074131 A1* | 3/2018 | Lim | G01R 31/367 |
| 2019/0221831 A1* | 7/2019 | Hayashi | H01M 4/131 |
| 2019/0252658 A1* | 8/2019 | Yoshimaru | H01M 50/42 |
| 2020/0166580 A1* | 5/2020 | Jung | G01R 31/389 |
| 2020/0313152 A1* | 10/2020 | Stefanopoulou | H01M 50/578 |

FOREIGN PATENT DOCUMENTS

| | | | | |
|---|---|---|---|---|
| CN | 104048987 A | | 9/2014 | |
| JP | 2012-215537 A | | 11/2012 | |
| JP | 5766117 B2 | | 8/2015 | |
| JP | 2016-18722 A | | 2/2016 | |
| JP | 2017016787 A | * | 1/2017 | ............ Y02E 60/10 |
| JP | 6230170 B2 | | 11/2017 | |
| JP | 6246164 B2 | | 12/2017 | |
| JP | 2019-15701 A | | 1/2019 | |
| JP | 2019-185893 A | | 10/2019 | |

* cited by examiner

*Primary Examiner* — Alexander Satanovsky
*Assistant Examiner* — Trung Q Nguyen
(74) *Attorney, Agent, or Firm* — Sughrue Mion, PLLC

(57) ABSTRACT

There is provided a test device for a secondary battery, the test device including: a test jig including a nail portion configured to pierce the secondary battery and a heater configured to raise a temperature of the nail portion by being supplied with electric power; and a moving mechanism configured to move the nail portion toward the secondary battery.

17 Claims, 15 Drawing Sheets

TEST JIG, TEST DEVICE, AND TEST METHOD FOR SECONDARY BATTERY

CROSS-REFERENCE TO RELATED APPLICATIONS

This application is based on Japanese Patent Application No. 2020-164870 filed on Sep. 30, 2020, the contents of which are incorporated herein by way of reference.

TECHNICAL FIELD

The present invention relates to a test jig, a test device, and a test method for a secondary battery.

BACKGROUND

Patent Literature 1 discloses a test method for evaluating safety when thermal runaway accompanying with a rapid temperature raise occurs in a secondary battery such as a lithium ion battery. Specifically, a unit battery is heated to forcibly cause thermal runaway in the test method disclosed in Patent Literature 1.

Patent Literature 1: Japanese Patent No. 6246164

In a test method in which a surface of a unit battery is heated from the outside as in the test method disclosed in Patent Literature 1, there are problems that a time required for transferring heat to an inner side of the unit battery to cause thermal runaway of the unit battery is long and it is impossible to efficiently cause thermal runaway of the unit battery.

The above problems occur not only in a test for evaluating safety when thermal runaway occurs in one unit battery among a plurality of unit batteries constituting a battery pack, but also occurs in a test for evaluating safety when thermal runaway occurs in one secondary battery.

The present invention has been made in view of such circumstances, and an object of the present invention is to provide a test jig, a test device, and a test method for a secondary battery that can efficiently cause thermal runaway when safely of the secondary battery is evaluated.

SUMMARY

A test jig for a secondary battery according to one aspect of the present invention includes: a nail portion configured to pierce the secondary battery; and a heater configured to raise a temperature of the nail portion by being supplied with electric power.

In the above test jig, the heater may be built in the nail portion.

In the above test jig, the heater may be attached to an outer peripheral surface of the nail portion.

The above test jig may further include a temperature detector configured to detect the temperature of the nail portion.

A test device for a secondary battery according to other aspect of the present invention includes: the above test jig; and a moving mechanism configured to move the nail portion toward live secondary battery.

Further, a test device for a secondary battery includes: the above test jig; a support member configured to support the nail portion: and a moving mechanism configured to cause a movement of the nail portion toward the secondary battery in accordance with a movement of the support member by moving the support member. The heater is configured to raise the temperature of the nail portion via the support member.

A test method for a secondary battery according to other aspect of the present invention includes; a heating step of raising a temperature of a nail portion by a heater, and a nail piercing step of piercing the nail portion into the secondary battery.

In the above test method, the heating step may be executed after the nail piercing step.

The above test method may further include a thermal runaway monitoring step of monitoring thermal runaway of the secondary battery in accordance with an internal short circuit caused by piercing of the nail portion alter the nail piercing step. The heating step may be executed when it is determined in the thermal runaway monitoring step that the thermal runaway of the secondary battery does not occur within a predetermined time.

In the above test method, the nail piercing step may be executed after the heating step.

DESCRIPTION OF EMBODIMENTS

Hereinafter, a test jig, a test device, and a test method for a secondary battery according to the present embodiment will be described with reference to the drawings.

The test jig, the test device, and the test method for a secondary battery according to the present embodiment are applied to a test for evaluating safely when thermal runaway accompanying with a rapid temperature raise occurs in a secondary battery such as a lithium ion battery. An application range of the present embodiment covers not only a test in which one secondary battery is to be tested, but also a test in which a battery pack configured by combining a plurality of unit batteries is to be tested. When one secondary battery is to be tested, safety is evaluated as to whether ignition, rupture, or the like occurs by forcibly causing thermal runaway of the secondary battery. On the other hand, when a battery pack is to be tested, safety is evaluated as to whether other unit batteries catch fire when forcibly causing thermal runaway of one unit battery among a plurality of unit batteries constituting the battery pack. Hereinafter, the test jig, the test device, and the test method for a secondary battery according to the present embodiment will be described by taking a case where a battery pack is to be tested as an example.

Test Device

First Embodiment

Figure 1:
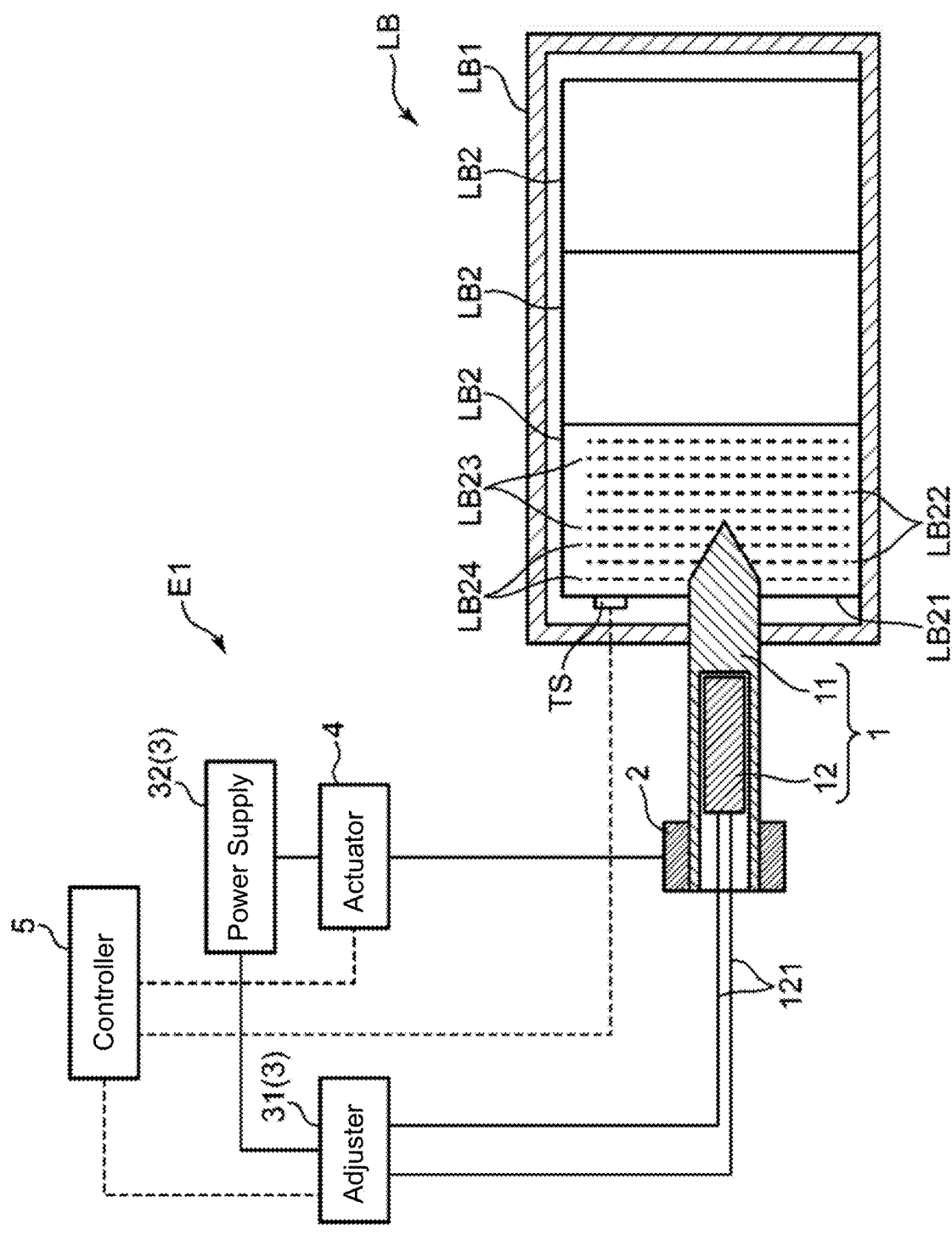
FIG. 1 is a diagram showing a configuration of a test device according to a first embodiment of the present invention.

FIG. 1 is a diagram showing a configuration of a test device E1 according to a first embodiment of the present invention. The test device E1 shown in FIG. 1 is applied to a catch fire resistance test in which thermally runaway of one unit battery LB2 among a plurality of unit batteries LB2 constituting a battery pack LB is forcibly caused to evaluate whether the other unit batteries LB2 catch fire.

Before describing a configuration of the test device E1, the battery pack LB will be described. In the battery pack LB, a plurality of unit batteries LB2 are arranged in a battery pack case LB1 formed of plastic. Each of the unit batteries LB2 is a secondary battery such as a lithium ion battery. Each of the unit batteries LB2 includes a battery case LB21 formed of metal, an electrolytic solution (not shown) contained in the battery case LB21, a cathode LB22 and an anode LB23 that are immersed in the electrolytic solution in the battery case LB21, and a separator LB24 interposed between the cathode LB22 and the anode LB23 in the battery case LB21. In the example show n in FIG. 1, a plurality of flat plate shaped cathodes LB22 and a plurality of flat plate shaped anodes LB23 are alternately arranged in parallel to each other, and the flat plate shaped separator LB24 is disposed between the cathode LB22 and the anode LB23 adjacent to each other. Further the separator LB24 is disposed at a position where the cathode LB22 or the anode LB23 and the battery case LB21 face each other such that the separator LB24 is interposed between the cathode LB22 or the anode LB23 and the battery case LB21.

As shown in FIG. 1. the test device E1 includes a test jig 1, a support member 2, a power supply unit 3, an actuator 4, and a controller 5.

Figure 2:
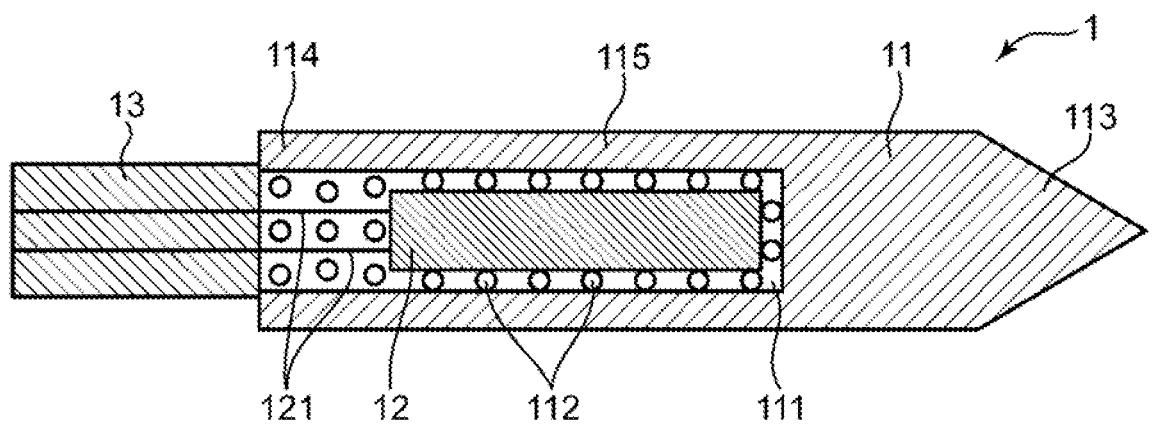
FIG. 2 is a cross-sectional view showing a configuration of a test jig applied to the test device in FIG. 1.

The test jig 1 is a jig used when forcibly causing thermal runaway of one unit battery LB2 among the plurality of unit batteries LB2 constituting the battery pack LB. The test jig 1 will be described with reference to the cross-sectional view in FIG. 2. The test jig 1 includes a nail portion 11 and a heater 12.

The nail portion 11 is a rod-shaped member that passes through the battery pack case LB1, and when the nail portion 11 pierces a unit battery LB2 facing the battery pack case LB1, the nail portion 11 can cause a pseudo internal short circuit in the unit battery LB2. The pseudo internal short circuit refers to a state where the cathode LB22 and the anode LB23 are short-circuited by the nail portion 11 or a state where the cathode LB22 and the anode LB23 are short-circuited due to physical deformation caused by the nail piercing, in the unit battery LB2. A cross-sectional shape of the nail portion 11 perpendicular to an axial direction is not particularly limited, and is a circular shape in the present embodiment. The nail portion 11 is formed of a metal material having good conductivity and thermal conductivity and having such hardness that the nail portion 11 is not deformed when the nail portion 11 pierces the unit battery LB2. The nail portion 11 may be formed of a material having no conductivity, such as ceramic. The nail portion 11 has a pointed lip end portion 113 positioned at an end portion at one side in the axial direction and a base end portion 114 positioned at an end portion at the other side opposite to the one side in the axial direction. The tip end portion 113 of the nail portion 11 pierces the unit battery LB2 in a stale where the base end portion 114 is supported by the support member 2 which will be described later.

Further, the nail portion 11 includes a bottomed hole 111 extending from the base end portion 114 to an intermediate portion 115 between the tip end portion 113 and the base end portion 114 in the axial direction, in the nail portion 11. The bottomed hole 111 is formed at the center of the nail portion 11 in a radial direction. The bottomed hole 111 of the nail portion 11 is filled with a particulate inorganic insulating material 112 having electrical insulation.

The heater 12 generates heat so as to raise the temperature of the nail portion 11 when the heater 12 is supplied with electric power from the power supply unit 3 to be described later. The heater 12 heats the nail portion 11 by raising the temperature of the nail portion 11 by heat generated by the heater 12. A pair of conductive wires 121 are connected to the heater 12. The heater 12 generates heat when electric power is supplied via the pair of conductive wires 121. When the heater 12 generates heat, the temperature of the nail portion 11 is raised. The heater 12 is built in the nail portion 11 in a manner of being disposed in the intermediate portion 115 in a state where the heater 12 is accommodated in the bottomed hole 111 of the nail portion 11. That is, the heater 12 is built in the intermediate portion 115 of the nail portion 11. In a state where the heater 12 is accommodated in the bottomed hole 111 of the nail portion 11, the displacement of the heater 12 is restricted by the inorganic insulating material 112 filled in the bottomed hole 111 so as to prevent the heater 12 from coming into contact with an inner surface of the nail portion 11.

The heater 12 is a resistance heating element that generates heat when the heater 12 is supplied with electric power via the pair of conductive wires 121. The heater 12 is formed of a metal heating element formed of a metal such as nickel-chromium and iron-chromium-aluminum. The heater 12 may be formed of a non-metal heating element such as silicon carbide and carbon. A shape of the heater 12 is not particularly limited, and may be any one of a linear shape, a spiral shape, a plate shape, and the like. The heater 12 is preferably disposed at the center in the radial direction of the nail portion 11 in the bottomed hole 111 of the nail portion 11, but may be disposed at a position shifted from the center in the radial direction to an outer side within an allowable range. A plurality of heaters 12 may be disposed in the bottomed hole 111 of the nail portion 11. In this case, the plurality of heaters 12 are arranged at predetermined intervals in the radial direction of the nail portion 11 in the bottomed hole 111.

The pair of conductive wires 121 are conductive wires through which a current flows when electric power is supplied to the heater 12. One end of each of the pair of conductive wires 121 is connected to the heater 12, and the other end opposite to the one end is connected to a temperature raising adjuster 31 of the power supply unit 3 to be described later. The pair of conductive wires 121 extend from the base end portion 114 of the nail portion 11 to the outside of the nail portion 11. Portions of the pair of conductive wires 121 extending from the nail portion 11 are covered with a covering material 13 having electrical insulation.

The heater 12 is not limited to the above-described configuration, and may be configured by a cartridge heater in which a resistance heating element is accommodated in a metal sheath tube filled with an inorganic insulating material. In this case, the cartridge heater is accommodated in the bottomed hole 111 of the nail portion 11. In a state where the cartridge heater is accommodated in the bottomed hole 111, displacement of the cartridge heater is restricted by the inorganic insulating material 112 filled in the bottomed hole 111. When a cartridge heater is used as the heater 12, it is not necessary to fill the bottomed hole 111 of the nail portion 11 with the inorganic insulating material 112. In this case, the cartridge heater can be fixed to the nail portion 11 by press-lining the cartridge heater into the bottomed hole 111 such that at least a tip end of the metal sheath tube of the cartridge heater comes into contact with an inner surface of the nail portion 11 that defines the bottomed hole 111. The cartridge heater may be fixed by being bonded to the inter surface of the nail portion 11 that defines the bottomed hole 111 by using an adhesive having good thermal conductivity and heat resistance.

As shown in FIG. 1, the support member 2 is a member that supports the nail portion 11. The support member 2 supports the nail portion 11 by clamping the base end portion 114 of the nail portion 11. As a support structure of the nail portion 11 by the support member 2, a structure in which the base end portion 114 of the nail portion 11 is fastened to the support member 2 by a fastening member or the like may be adopted. The support member 2 is formed of a material having good electrical insulation and thermal conductivity. The support member 2 is moved by the actuator 4 to be described later. The nail portion 11 supported by the support member 2 can be moved by moving the support member 2.

The power supply unit 3 supplies electric power to the heater 12 via the pair of conductive wires 121. The power supply unit 3 includes the temperature raising adjuster 31 and a power supply 32. The pair of conductive wires 121 and the power supply 32 are connected to the temperature raising adjuster 31. The temperature raising adjuster 31 is an electric power adjuster that can adjust the electric power supplied to the heater 12 via the pair of conductive wires 121. The temperature raising adjuster 31 can adjust an amount of heat generated by the heater 12 by adjusting the electric power supplied to the heater 12 by the power supply 32. That is, the temperature raising adjuster 31 can adjust the temperature of the nail portion 11 raised by the heater 12 by adjusting the electric power supplied to the heater 12 by the power supply 32. The temperature raising adjuster 31 is controlled by the controller 5 to be described later.

The actuator 4 is a moving mechanism that linearly moves the support member 2 by the electric power supplied from the power supply 32. The actuator 4 linearly moves the nail portion 11 toward the unit battery LB2 in accordance with the movement of the support member 2. The actuator 4 moves the support member 2 when the nail portion 11 pierces the unit battery LB2 and when the nail portion 11 that pierced the unit battery LB2 is separated away from the unit battery LB2. The actuator 4 may have a structure that moves the nail portion 11 relative to the unit battery LB2. For example, the actuator 4 may have a structure of moving a holding stage that holds the battery pack LB instead of a structure of moving the support member 2. Even in this case, the actuator 4 can move the nail portion 11 relative to the unit battery LB2. The actuator 4 is controlled by the controller 5 to be described later.

The power supply 32 supplies electric power to the heater 12 via the temperature raising adjuster 31, and supplies electric power to the actuator 4. Although FIG. 1 shows a configuration in which one power supply 32 is connected to the temperature raising adjuster 31 and the actuator 4, the power supply 32 may be individually provided for each of the temperature raising adjuster 31 and the actuator 4.

The controller 5 includes a central processing unit (CPU), a read only memory (ROM) that stores a control program, a random access memory (RAM) that is used as a work area of the CPU, and the like. The controller 5 controls the temperature raising adjuster 31 and the actuator 4 by the CPU executing a control program stored in lire ROM. As shown in FIG. 1, a temperature sensor TS that detects a surface temperature of the unit battery LB2 is electrically connected to the controller 5. Accordingly, information related to the surface temperature of the unit battery LB2 detected by the temperature sensor TS is input into the controller 5. The temperature sensor TS is mounted on a surface of the unit battery LB2.

The controller 5 executes a nail piercing control, a heating control, a thermal runaway monitoring control, and a test ending control in a test of forcibly causing thermal runaway of one unit battery LB2 among the plurality of unit batteries LB2 constituting the battery pack LB.

The controller 5 controls the actuator 4 in the nail piercing control to move the support member 2 so that the nail portion 11 pierces the unit battery LB2. A pseudo internal short circuit occurs in the unit battery LB2 that is pierced by the nail portion 11. When an internal short circuit occurs in the unit battery LB2, heat is generated in an internal short circuit portion of the unit battery LB2.

In the heating control, the controller 5 controls the temperature raising adjuster 31 to adjust electric power supplied to the heater 12 via the pair of conductive wires 121. Accordingly, the temperature of the nail portion 11 is raised by the heat generated by the heater 12.

In the thermal runaway monitoring control, the controller 5 monitors thermal runaway of the unit battery LB2 based on a detection result of the temperature sensor TS, and determines whether the unit battery LB2 reached thermal runaway. When the detection result of the temperature sensor TS is a result indicating a rapid temperature raise of the unit battery LB2, the controller 5 determines that the unit battery LB2 reached thermal runaway. On the other hand, when there is no rapid temperature raise of the unit battery LB2, the controller 5 determines that the unit battery LB2 does not reach thermal runaway.

The controller 5 executes the test ending control when a predetermined time elapses after the unit battery LB2 reaches thermal runaway. In the test ending control, the controller 5 controls the actuator 4 to move the support member 2 such that the nail portion 11 that pierced the unit battery LB2 is separated from the unit battery LB2. Further, in the test ending control, the controller 5 controls the temperature raising adjuster 31 to stop the supply of electric power to the heater 12 via the pair of conductive wires 121.

As described above, in the test device E1 including the test jig 1, the temperature of the nail portion 11 that pierces the unit battery LB2 and comes into contact with an inner side of the unit battery LB2 can be increased by the heater 12. Therefore, when the nail portion 11 pierces the unit battery LB2, heat of the nail portion 11 is directly transferred to the inner side of the unit battery LB2 by a heat transfer from the nail portion 11 whose temperature is raised by the heater 12, and the inner side of the unit battery LB2 can be forcibly heated. In a case where an internal short circuit occurs in the unit battery LB2 due to the piercing of the nail portion 11 and heat is generated, the inner side of the unit battery LB2 can be forcibly heated by the heat transferred from the nail portion 11 whose temperature is raised by the heater 12 in addition to the generated heat. Accordingly, when safety is evaluated by forcibly causing thermal runaway of the unit battery LB2, it is possible to efficiently cause thermal runaway.

In a test using the test jig 1, the inner side of the unit battery LB2 is heated by the heat transferred from the nail portion 11 dial pierced the unit battery LB2, so that the internal short circuit portion of the unit battery LB2 can be directly heated. In addition, it is possible to reduce an influence of heating the oilier unit batteries LB2 constituting the battery pack LB by heating the inner side of the unit battery LB2 by the heat transferred from the nail portion 11, as compared with, for example, a case where a surface of the unit battery LB2 is heated.

Since the heater 12 is built in the nail portion 11 in the test jig 1, the heat generated by the heater 12 can be efficiently transferred to the nail portion 11 without being dissipated to the outside. Therefore, the heater 12 can effectively raise the temperature of the nail portion 11. Accordingly, forcibly heating the inner side of the unit battery LB2 can be effectively performed accompanying with the heat transfer from the nail portion 11 to the internal short circuit portion. Since the heater 12 is built in the nail portion 11, it is possible to prevent the heater 12 from coming into contact with the unit battery LB2.

Modification of First Embodiment

Figure 3:
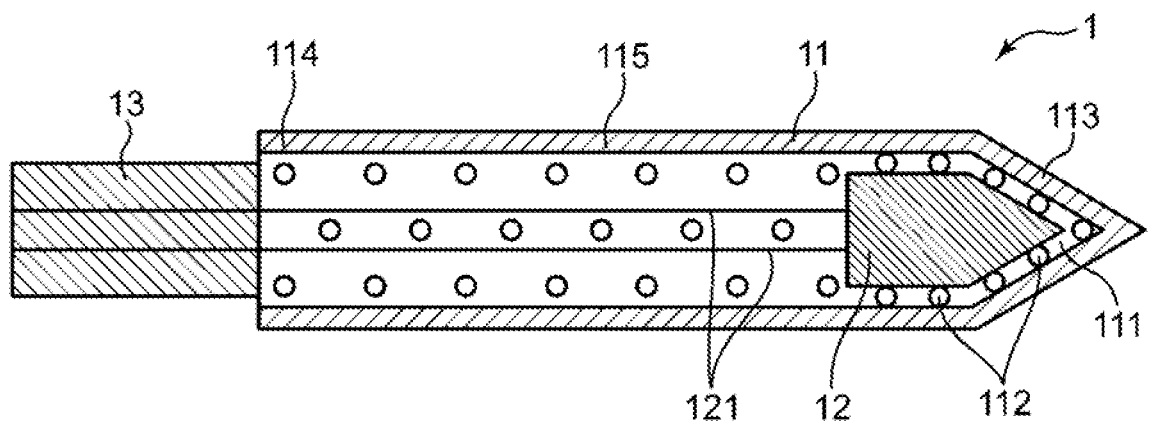
FIG. 3 is a cross-sectional view showing a configuration of a modification of the test jig applied to the test dev ice in FIG. 1.

A structure of a test jig applied to the test device E1 according to the first embodiment is not limited to the structure of the test jig 1 described above. FIG. 3 is a cross-sectional view showing a modification of the test jig 1 applied to the test device E1. In the test jig 1 according to the present modification, an arrangement position of the heater 12 relative to the nail portion 11 is different from that of the test jig 1 described above.

As shown in FIG. 3, in the test jig 1 according to the present modification, the bottomed hole 111 filled with the inorganic insulating material 112 in the nail portion 11 is formed in a manner of extending from the base end portion 114 to a region including the tip end portion 113. The heater 12 is built in the nail portion 11 in a manner of being disposed in the tip end portion 113 in a state where the heater 12 is accommodated in the bottomed bole 111 of the nail portion 11. That is, the heater 12 is built in the tip end portion 113 of the nail portion 11. In the test jig 1 having such a structure, it is possible to efficiently raise the temperature of the tip end portion 113 of the nail portion 11 that pierces the unit battery LB2 by the heat generated by the heater 12. Therefore, when safety is evaluated by forcibly causing thermal runaway of the unit battery LB2, it is possible to efficiently cause thermal runaway.

Second Embodiment

Figure 4:
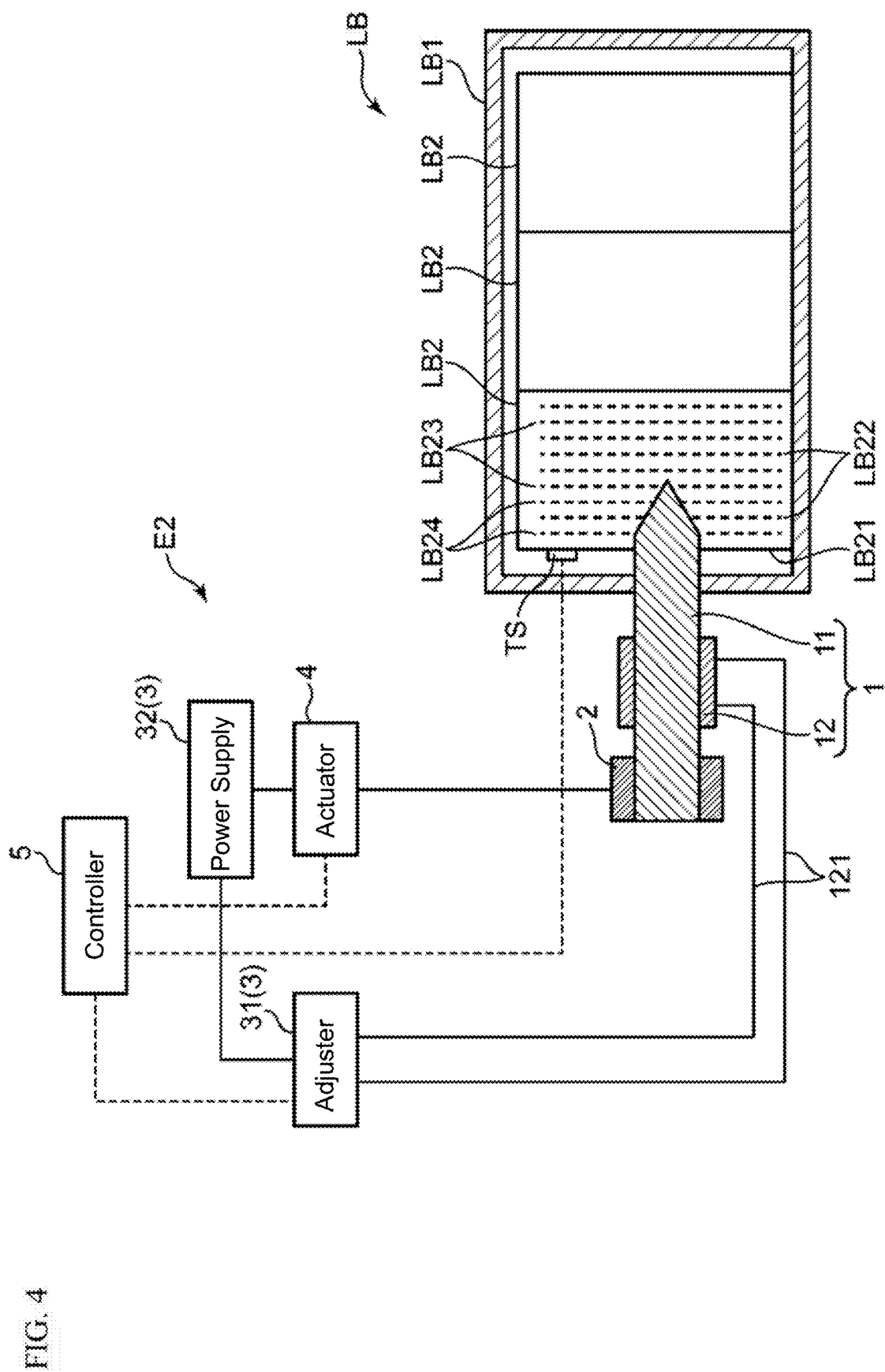
FIG. 4 is a diagram showing a configuration of a test device according to a second embodiment of the present invention.
Figure 5:
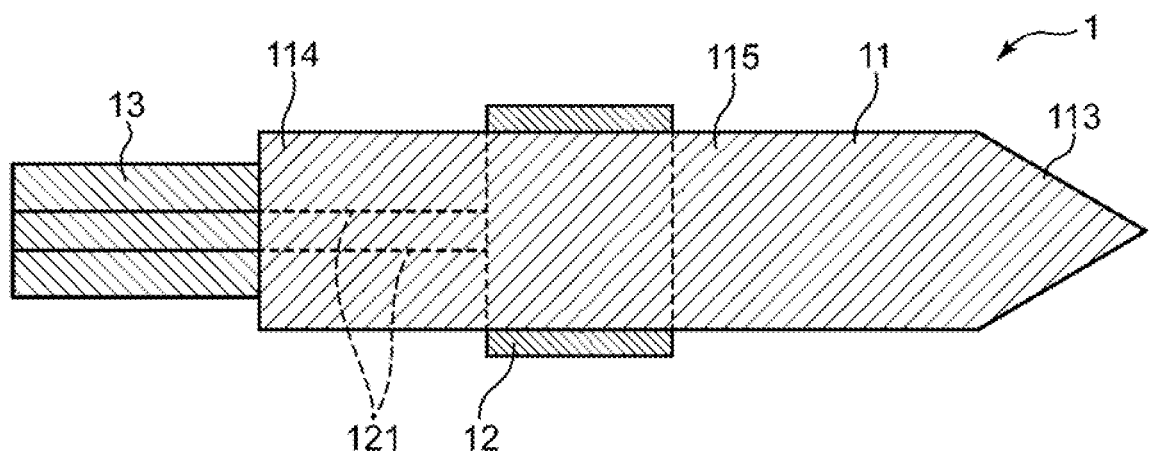
FIG. 5 is a cross-sectional view showing a configuration of a test jig applied to the test device in FIG. 4.

FIG. 4 is a diagram showing a configuration of a test device E2 according to a second embodiment of the present invention. FIG. 5 is a cross-sectional view showing a configuration of the test jig 1 applied to the test device E2. Here, components different from those in the first embodiment will be described, and description of the other components will be omitted.

In the test device E2 according to the second embodiment, a structure of the test jig 1 is different from that in a case where the test jig 1 is applied to the test device E1 according to the first embodiment.

In the test jig 1 according to the second embodiment, no bottomed hole is formed in the nail portion 11. The heater 12 is attached to an outer peripheral surface of the nail portion 11. Specifically, the heater 12 is attached to the intermediate portion 115 between the tip end portion 113 and the base end portion 114 on the outer peripheral surface of the nail portion 11. That is, the heater 12 is disposed on the outer peripheral surface of the nail portion 11 at a position where the heater 12 does not come into contact with the unit battery LB2 in a state where the nail portion 11 pierces the unit battery LB2. The attachment position of the heater 12 on the outer peripheral surface of the nail portion 11 is not limited to the intermediate portion 115 as long as the heater 12 does not come into contact with the unit battery LB2. For example, the heater 12 may be attached to the outer peripheral surface of the nail portion 11 at a position closer to the tip end portion 113 than the intermediate portion 115, or may be attached to the outer peripheral surface of the nail portion 11 it a position closer to the base end portion 114 than the intermediate portion 115. The heater 12 has a multilayer structure including a resistance heating layer that generates heat by being supplied with electric power via the pair of conductive wires 121, and an insulating layer that is disposed between the resistance heating layer and the outer peripheral surface of the nail portion 11. The resistance heating layer is formed of a resistance heating element such as a metal heating element or a non-metal heating element. The insulating layer is formed of a material having good electrical insulation. A shape of the heater 12 is not particularly limited, and may be any one of a sheet shape, a cylindrical shape, and the like. The heater 12 is attached to the outer peripheral surface of the intermediate portion 115 of the nail portion 11 by being bonded using an adhesive having good thermal conductivity and heat resistance, by being fastened using a caulking part, or the like.

In the test device E2, the temperature of the nail portion 11 that pierces the unit battery LB2 can be raised by the heat generated by the heater 12 attached to the outer peripheral surface of the nail portion 11. Therefore, when the nail portion 11 pierces the unit battery LB2, the inner side of the unit battery LB2 can be forcibly heated by the heat transferred from the nail portion 11 whose temperature is raised by the heater 12. In a case where an internal short circuit occurs in the unit battery LB2 due to the piercing of the nail portion 11 and heat is generated, the inner side of the unit battery LB2 can be forcibly heated by the heat transferred from the nail portion 11 whose temperature is raised by the heater 12 in addition to the generated heat. Accordingly, when safety is evaluated by forcibly causing thermal runaway of the unit battery LB2, it is possible to efficiently cause thermal runaway.

In addition, since the heater 12 is attached to the outer peripheral surface of the nail portion 11, the outer peripheral surface of the nail portion 11 that is in contact with the inner side of the unit battery LB2 in a slate in which the nail portion 11 pierces the unit battery LB2 can be efficiently heated. Accordingly, forcibly heating the inner side of the unit battery LB2 can be effectively performed accompanying with the heat transfer from the nail portion 11. Further, the nail portion 11 can be reduced in size by attaching the heater 12 to the outer peripheral surface of the nail portion 11.

Third Embodiment

Figure 6:
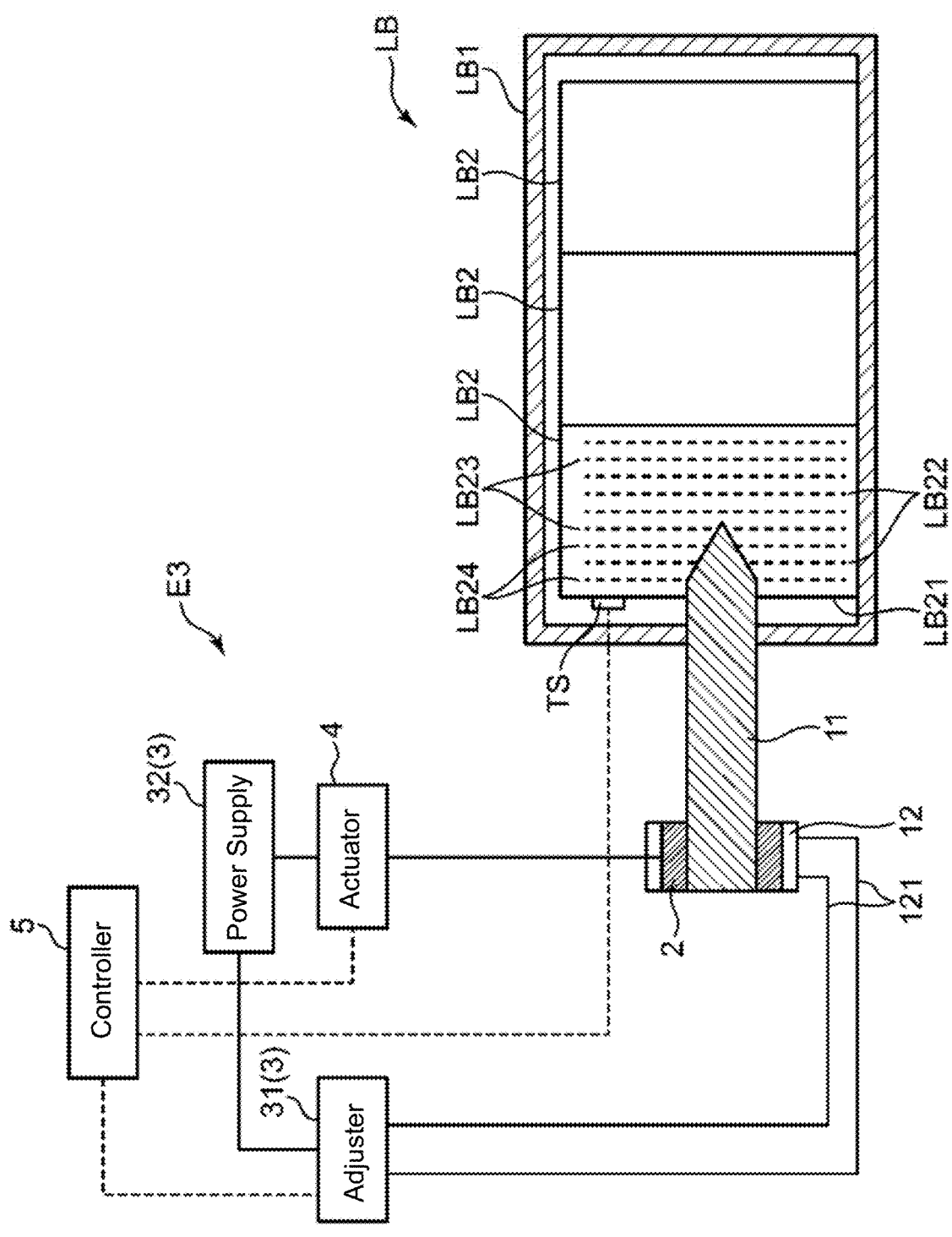
FIG. 6 is a diagram showing a configuration of a test device according to a third embodiment of the present invention.

FIG. 6 is a diagram showing a configuration of a test device E3 according to a third embodiment of the present invention. Here, components different from those in the first embodiment will be described and description of the other components will be omitted.

The nail portion 11 applied to the test device E3 is a nail member generally used in a nail piercing test for evaluating safely of a secondary battery. Therefore, different from the test jig 1 according to the first embodiment and the second embodiment, the nail portion 11 does not include a heater. Instead, in the test device E3, the heater 12 is attached to the support member 2 that supports the nail portion 11.

The heater 12 raises the temperature of the nail portion 11 via the support member 2. Specifically, the heater 12 raises the temperature of the support member 2 by heat generated in response to a supply of electric power via the pair of conductive wires 121, the temperature of the nail portion 11 supported by the support member 2 is raised accompanying with the temperature raise of the support member 2.

The heater 12 may be attached to an outer peripheral surface of the support member 2, or may be embedded in the support member 2. In a case where the heater 12 is attached to the outer peripheral surface of the support member 2, the heater 12 may have a multilayer structure including a resistance heating layer that generates heat by being supplied with electric power via the pair of conductive wires 121 and an insulating layer disposed between the resistance heating layer and an outer peripheral surface of the nail portion 11. On the other hand, in the case where the heater 12 is embedded in the support member 2, the heater 12 may be a cartridge heater or the like in which a resistance heating element is accommodated in a metal sheath tube filled with an inorganic insulating material.

In the test device E3, since the heater 12 is attached to the support member 2, the temperature of the nail portion 11 can be raised by the heat transferred from the support member 2 that is heated by the heater 12. Therefore, the inner side of the unit battery LB2 can be forcibly heated by the heat transferred from the nail portion 11 whose temperature is raised by the heater 12 to the inner side of the unit battery LB2.

Fourth Embodiment

Figure 7:
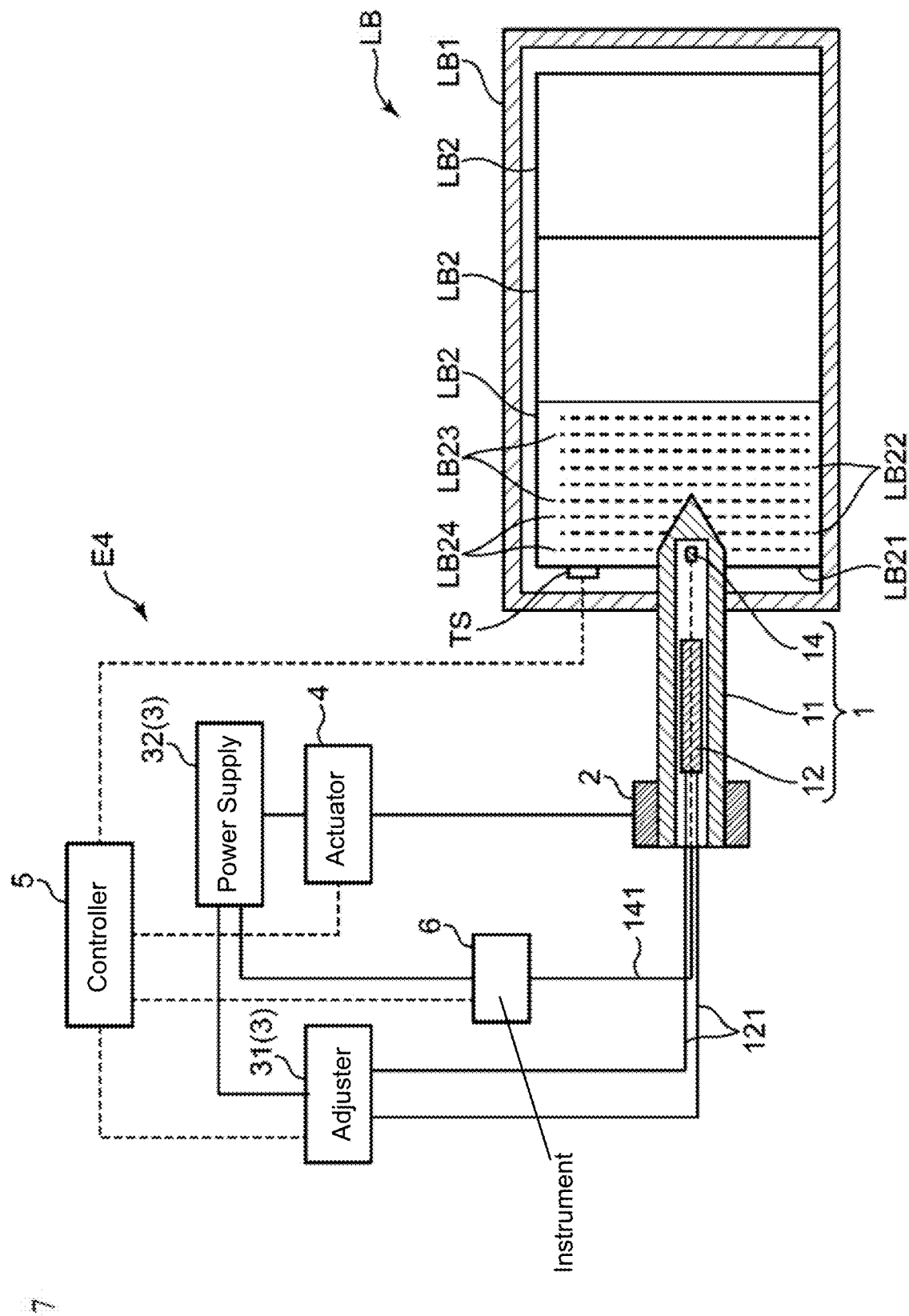
FIG. 7 is a diagram showing a configuration of a test device according to a fourth embodiment of the present invention.
Figure 8:
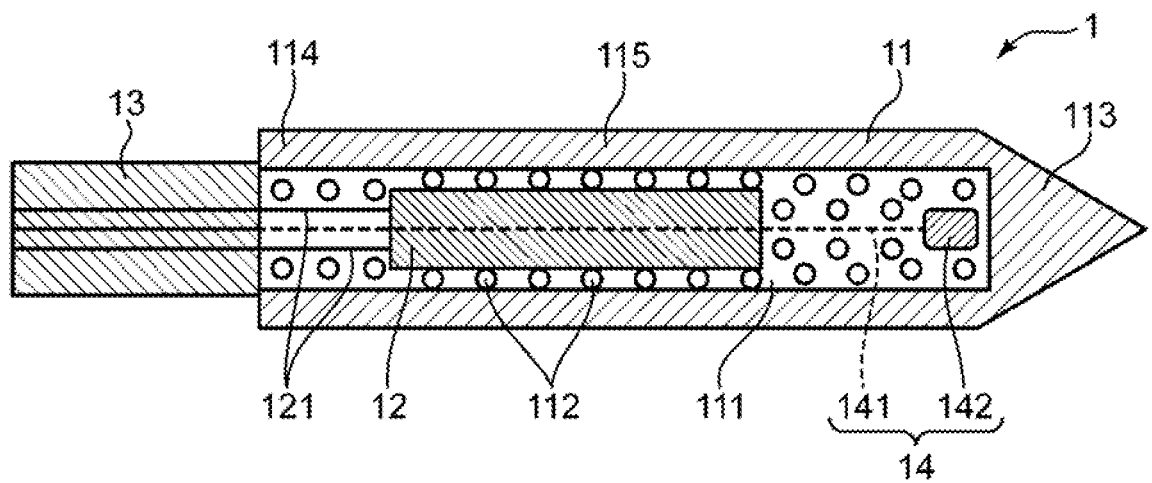
FIG. 8 is a cross-sectional view showing a configuration of a test jig applied to the test device in FIG. 7.

FIG. 7 is a diagram showing a configuration of a test device E4 according to a fourth embodiment of the present invention. FIG. 8 is a cross-sectional view showing a configuration of the test jig 1 applied to the test device E4. Here, components different from those in the first embodiment will be described, and description of the other components will be omitted.

In the test device E4 according to the fourth embodiment, a structure of the test jig 1 is different from that in a case where the test jig 1 is applied to the test device E1 according to the first embodiment. A measuring instrument 6 is further provided in the test device E4 as shown in FIG. 7.

The test jig 1 according to the fourth embodiment includes a thermocouple 14 in addition to the nail portion 11 and the heater 12.

The test jig 1 according to the fourth embodiment is the same as the test jig according to the first embodiment in that the heater 12 is built in the intermediate portion 115 of the nail portion 11.

The thermocouple 14 is a temperature detector dial detects the temperature of the nail portion 11 whose temperature is raised by the heater 12. As shown in FIG. 8, the thermocouple 14 includes a thermocouple wire 141 and a temperature measuring unit 142. The thermocouple 14 is built in the nail portion 11 by inserting the thermocouple wire 141 into the bottomed hole 111 of the nail portion 11 such that the temperature measuring unit 142 is positioned in the tip end portion 113. A position of the temperature measuring unit 142 in a state where the thermocouple wire 141 is inserted into the bottomed hole 111 is not limited to a position in the tip end portion 113. For example, in the thermocouple 14, the thermocouple wire 141 may be inserted into the bottomed hoe 111 such dial the temperature measuring unit 142 is positioned at a predetermined position between the tip end portion 113 and the base end portion 114.

The thermocouple wire 141 is disposed in a manner of being separated from the heater 12 in the bottomed hole 111 of the nail portion 11 filled with the inorganic insulating material 112. The thermocouple wire 141 has a pair (or a plurality of pairs) of wires formed of different kinds of metals. The pair of wires in the thermocouple wire 141 are coupled to the temperature measuring unit 142, and end portions at a side opposite to the temperature measuring unit 142 are also coupled via, for example, a compensation conductive wire. In this manner, the thermocouple wire 141 is configured based on a known Seebeck effect in which a closed loop is formed by different kinds of metals, and in which a thermoelectromotive force is generated when a temperature difference is given between the two coupling portions. That is, the thermocouple wire 141 generates a thermoelectromotive force in accordance with a temperature detected by the temperature measuring unit 142, and outputs a signal (a thermoelectromotive force signal) corresponding to the thermoelectromotive force. The thermoelectromotive force signal output from the thermocouple wire 141 is input into the measuring instrument 6.

The thermocouple 14 is not limited to the configuration described above, and the thermocouple wire 141 may be inserted into a protective tube filled with an inorganic insulating material. The protective tube may be formed of a metal material such as stainless steel, or may be formed of a non-metal material such as polytetrafluoroethylene.

As shown in FIG. 7, a thermocouple wire 141 and the power supply 32 are connected to the measuring instrument 6. The thermoelectromotive force signal output from the thermocouple wire 141 is input into the measuring instrument 6. The measuring instrument 6 converts the thermoelectromotive force indicated by the input thermoelectromotive force signal into a temperature, and outputs a measurement temperature signal indicating the converted temperature to the controller 5.

The controller 5 controls the temperature raising adjuster 31 based on the measurement temperature signal output from the measuring instrument 6.

As described above, in the test device E4, the temperature of the nail portion 11 that pierces the unit battery LB2 can be raised by the heater 12. Therefore, the inner side of the unit battery LB2 can be forcibly heated by the heat transferred from the nail portion 11 whose temperature is raised by the heater 12 to the inner side of the unit battery LB2.

Further, in the test device E4, the temperature of the nail portion 11 whose temperature is raised by the heater 12 can be detected based on the measurement temperature signal output from the measuring instrument 6 corresponding to the thermoelectromotive force from the thermocouple wire 141. Therefore, the controller 5 can control the temperature raising adjuster 31 while monitoring the temperature of the nail portion 11. Accordingly, the controller 5 can adjust an amount of heat generated by the heater 12 in accordance with the temperature of the nail portion 11 under the control of the temperature raising adjuster 31.

The controller 5 can also forecast the temperature of the internal short circuit portion of the unit battery LB2 that is in contact with the nail portion 11 based on a detection result of the temperature of the nail portion 11.

First Modification of Fourth Embodiment

Figure 9:
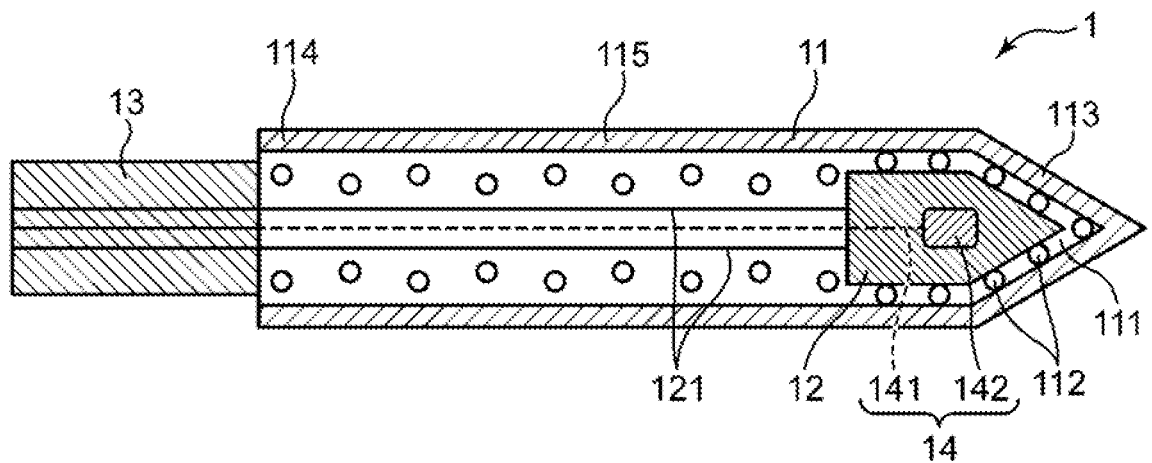
FIG. 9 is a cross-sectional view showing a configuration of a first modification of the test jig applied to the test device in FIG. 7.

A structure of the test jig 1 applied to the test device E4 according to the fourth embodiment is not limited to the structure described above. FIG. 9 is a cross-sectional view showing a modification of the test jig 1 applied to the test device E4. In the test jig 1 according to the present modification, an arrangement position of the heater 12 relative to the nail portion 11 is different from that of the test jig 1 described above.

As shown in FIG. 9, in the test jig 1 according to the present modification, the heater 12 is built in the nail portion 11 in a manner of being disposed in the tip end portion 113 in a state where the heater 12 is accommodated in the bottomed hole 111 of the nail portion 11. That is, the heater 12 is built in the lip end portion 113 of the nail portion 11.

In the test jig 1 according to the present modification, the thermocouple 14 is built in the nail portion 11 by inserting the thermocouple wire 141 into the bottomed hole 111 of the nail portion 11 such that the temperature measuring unit 142 is positioned in the tip end portion 113. The thermocouple wire 141 is disposed in a manner of being separated from the heater 12 in the bottomed hole 111 of the nail portion 11 filled with the inorganic insulating material 112.

In the test jig 1 having such a structure, the lip end portion 113 of the nail portion 11 that pierces the unit battery LB2 can be efficiently heated by the heat generated by the heater 12, and the temperature of the nail portion 11 can be detected by the thermocouple 14.

Second Modification of Fourth Embodiment

Figure 10:
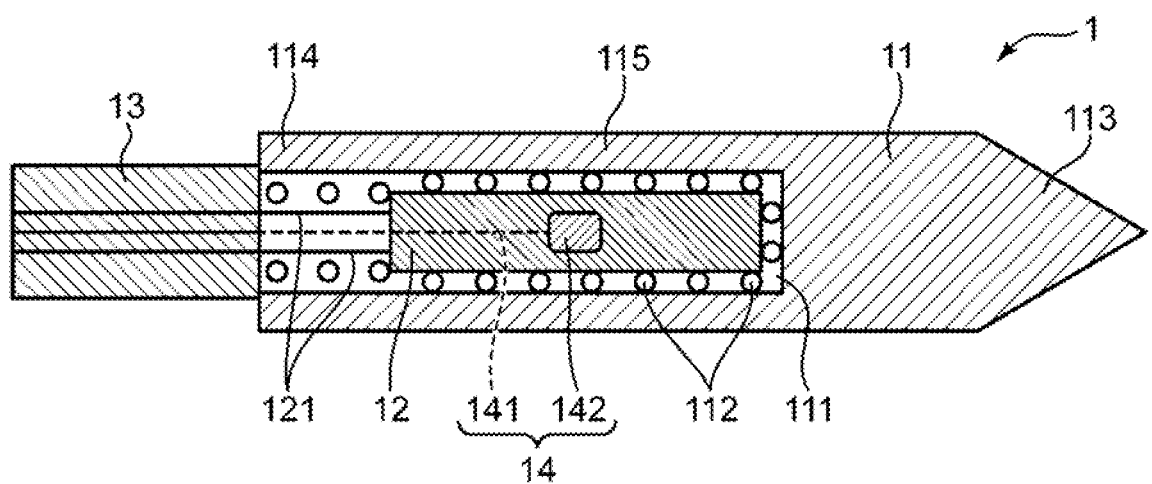
FIG. 10 is a cross-sectional view showing a configuration of a second modification of the test jig applied to the test device in FIG. 7.

FIG. 10 is a cross-sectional view shewing a modification of the test jig 1 applied to the test device E4. In the test jig 1 according to the present modification, an arrangement position of the thermocouple 14 relative to the nail portion 11 is different from that of the test jig 1 described above.

As shown in FIG. 10, in the test jig 1 according to the present modification, the heater 12 is built in the nail portion 11 in a manner of being disposed in the intermediate portion 115 in a state where the heater 12 is accommodated in the bottomed hole 111 of the nail portion 11. That is, the heater 12 is built in the intermediate portion 115 of the nail portion 11.

In the test jig 1 according to the present modification, the thermocouple 14 is built in the nail portion 11 by inserting the thermocouple wire 141 into the bottomed hole 111 of the nail portion 11 such that the temperature measuring unit 142 is positioned in the intermediate portion 115. The thermocouple wire 141 is disposed in a manner of being separated from the heater 12 in the bottomed hole 111 of the nail portion 11 filled with the inorganic insulating material 112.

In the test jig 1 having such a structure, the temperature of the intermediate portion 115 of the nail portion 11 in which the heater 12 is disposed can be appropriately detected by the thermocouple 14.

Fifth Embodiment

Figure 11:
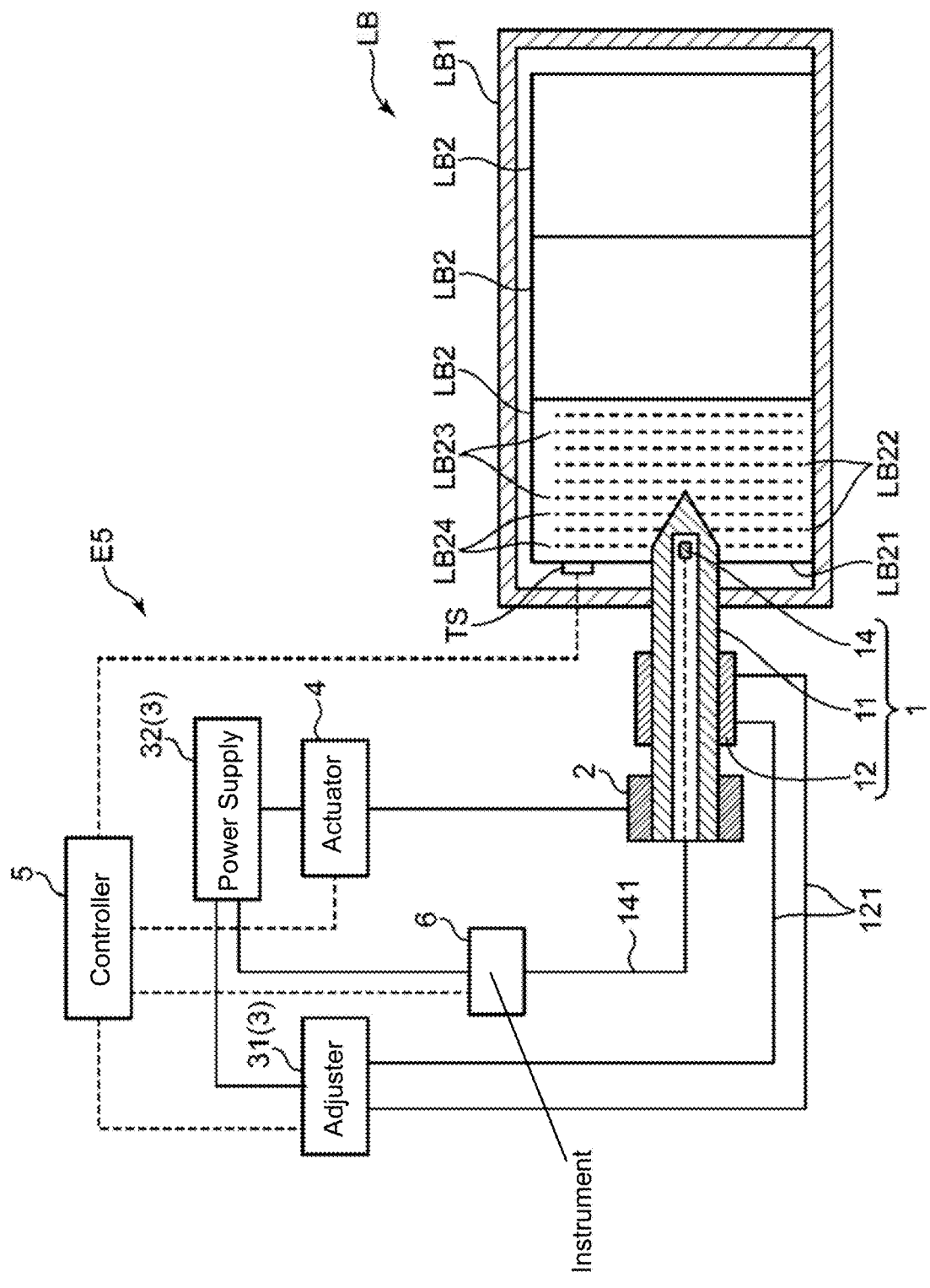
FIG. 11 is a diagram showing a configuration of a test device according to a fifth embodiment of the present invention.
Figure 12:
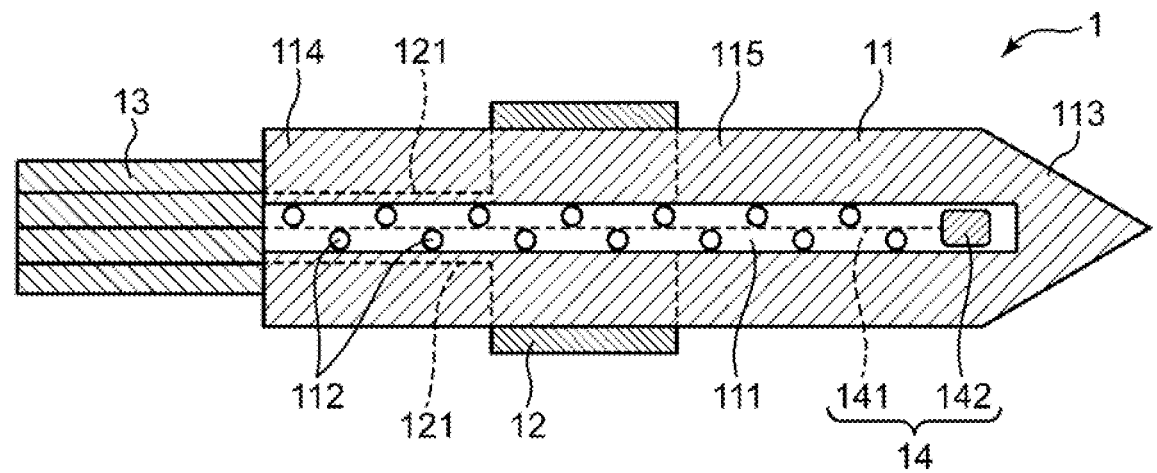
FIG. 12 is a cross-sectional view showing a configuration of a test jig applied to the test device in FIG. 11.

FIG. 11 is a diagram showing a configuration of a test device E5 according to a fifth embodiment of the present invention. FIG. 12 is a cross-sectional view showing a configuration of the test jig 1 applied to the test device E5. Here, components different from those in the fourth embodiment will be described, and description of the other components will be omitted.

In the test device E5 according to the fifth embodiment, a structure of the test jig 1 is different from that in a case where the test jig 1 is applied to the test device E4 according to the fourth embodiment.

In the test jig 1 according to the fifth embodiment, the bottomed hole 111 is formed in the nail portion 11 from the base end portion 114 to the tip end portion 113. The heater 12 is attached to an outer peripheral surface of the intermediate portion 115 of the nail portion 11. That is, the test jig 1 according to the fifth embodiment is the same as the test jig 1 according to the second embodiment in that the heater 12 is attached to the outer peripheral surface of the intermediate portion 115 of the nail portion 11.

In the test jig 1 according to the fifth embodiment, the thermocouple 14 is built in the nail portion 11 by inserting the thermocouple wire 141 into the bottomed hole 111 of the nail portion 11 such that the temperature measuring unit 142 is positioned in the tip end portion 113.

In the test device E5, the temperature of the nail portion 11 that pierces the unit battery LB2 can be raised by the heat generated by the heater 12 attached to the outer peripheral surface of the nail portion 11, and the temperature of the nail portion 11 can be detected by the thermocouple 14.

Modification of Fifth Embodiment

Figure 13:
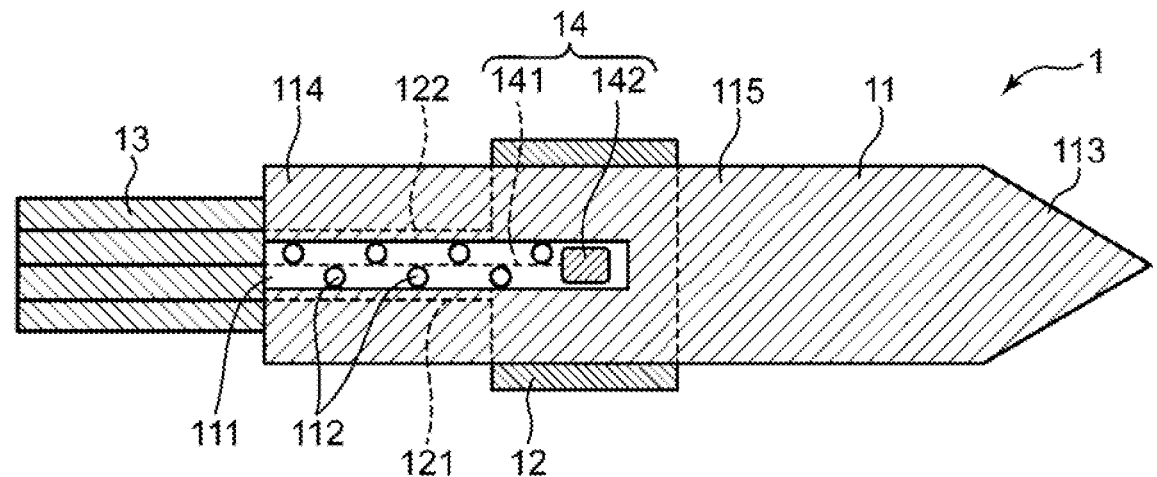
FIG. 13 is a cross-sectional view showing a configuration of a modification of the test jig applied to the test device in FIG. 11.

A structure of the test jig 1 applied to the test device E5 according to the fifth embodiment is not limited to the structure described above. FIG. 13 is a cross-sectional view showing a modification of the test jig 1 applied to the test device E5. In the test jig 1 according to the present modification, an arrangement position of the thermocouple 14 relative to the nail portion 11 is different from that of the test jig 1 described above.

As shown in FIG. 13, in the test jig 1 according to the present modification, the bottomed hole 111 is formed in the nail portion 11 from the base end portion 114 to the intermediate portion 115. The thermocouple 14 is built in the nail portion 11 by inserting the thermocouple wire 141 into the bottomed hole 111 of the nail portion 11 such that the temperature measuring unit 142 is positioned in the intermediate portion 115.

In the test jig 1 having such a structure, the temperature of the intermediate portion 115 in which the heater 12 is disposed on the outer peripheral surface of the nail portion 11 can be appropriately detected by the thermocouple 14.

Sixth Embodiment

Figure 14:
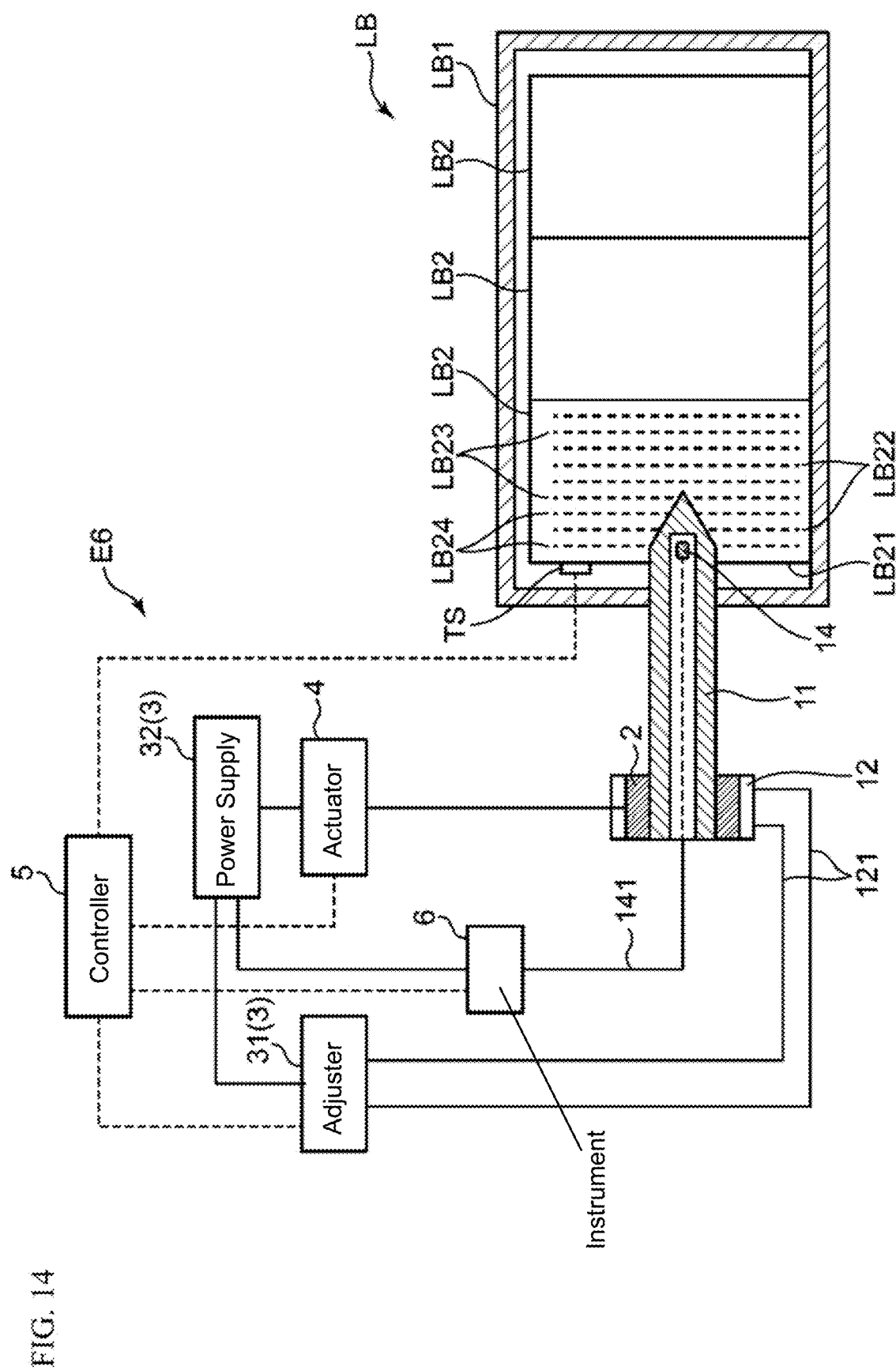
FIG. 14 is a diagram showing a configuration of a test device according to a sixth embodiment of the present invention.
Figure 15:
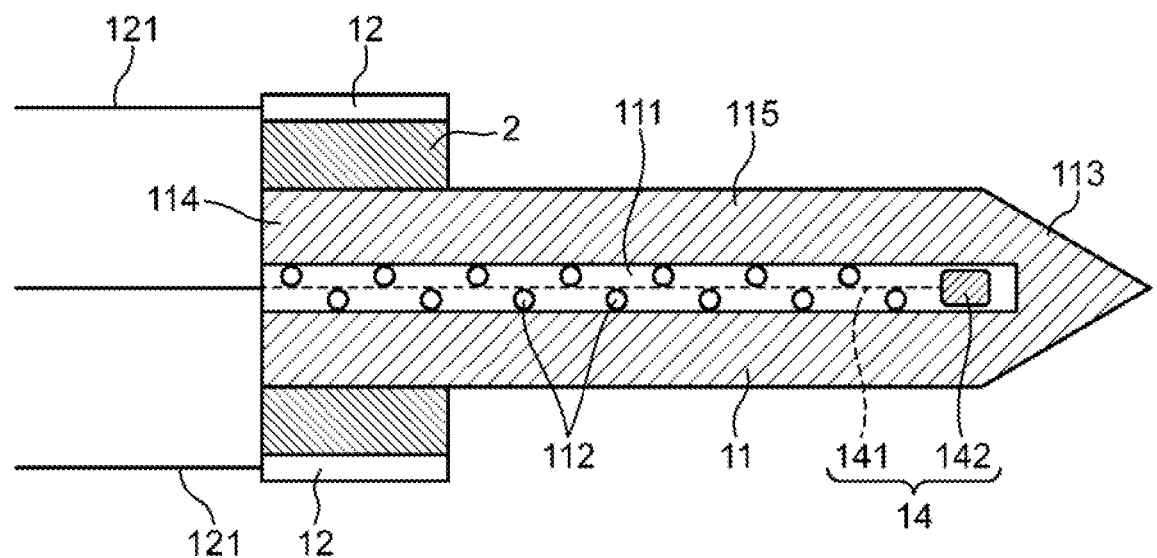
FIG. 15 is a cross-sectional view showing a configuration of a nail portion used in the test device in FIG. 14.

FIG. 14 is a diagram showing a configuration of a test device E6 according to a sixth embodiment of the present invention. FIG. 15 is a cross-sectional view showing a configuration of the nail portion 11 used in the test device E6. Here, components different from those in the fourth embodiment will be described, and description of the other components will be omitted.

In the test device E6, the heater 12 is attached to the support member 2 that supports the nail portion 11. The test device E6 is the same as the test device E3 according to the third embodiment in that the heater 12 is attached to the support member 2. The heater 12 raises the temperature of the nail portion 11 via the support member 2.

In the test device E6, since the heater 12 is attached to the support member 2, the temperature of the nail portion 11 that pierces the unit battery LB2 can be raised by the heat transferred from the support member 2 heated by the heater 12. Further, in the test device E6, the temperature of the nail portion 11 can be detected by the thermocouple 14 built in the nail portion 11.

Modification of Sixth Embodiment

Figure 16:
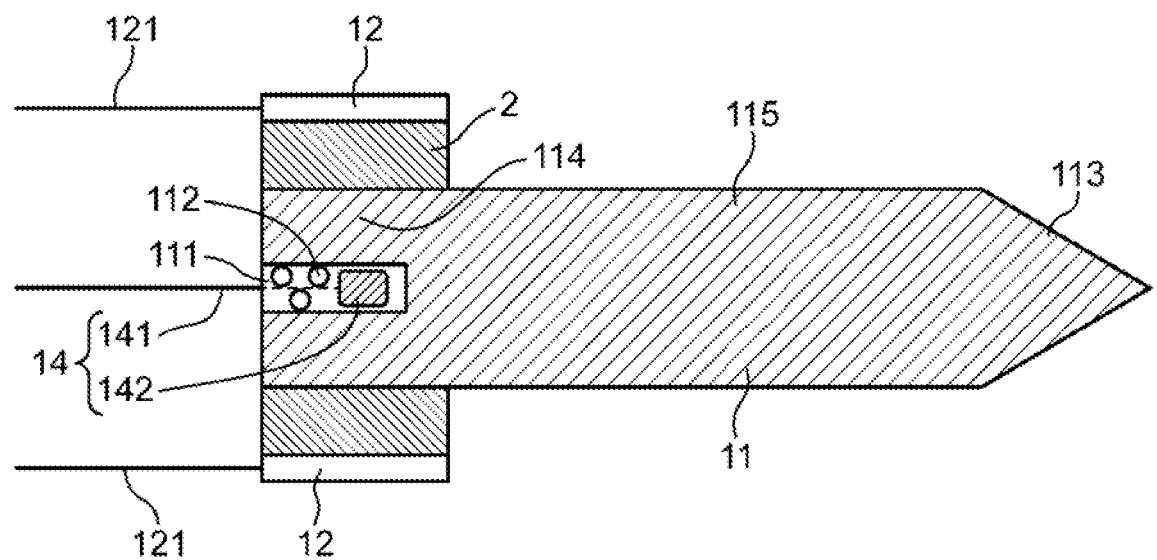
FIG. 16 is a cross-sectional view showing a configuration of a modification of the nail portion used in the test device in FIG. 14.

A structure of the nail portion 11 used in the test device E6 according to the sixth embodiment may be a structure shown in FIG. 16. In the example shown in FIG. 16, the bottomed hole 111 is formed in the base end portion 114 of the nail portion 11. In this case, the thermocouple 14 is built in the base end portion 114 of the nail portion 11 by inserting the thermocouple wire 141 into the bottomed hole 111 of the nail portion 11 such that the temperature measuring unit 142 is positioned in the base end portion 114.

In the nail portion 11 in which the thermocouple 14 is built in the base end portion 114, the temperature of the base end portion 14 that is in contact with the support member 2 heated by the heater 12 can be appropriately detected by the thermocouple 14.

Test Method

Next, a test method for a secondary battery will be described. Each step of the test method for a secondary battery is performed under the control of the controller 5 provided in the test devices E1 to E6 according to the first to sixth embodiments. Hereinafter, the test method for a secondary battery will be described by taking a case where the test device E1 according to the first embodiment is used as an example.

First Test Method

Figure 17:
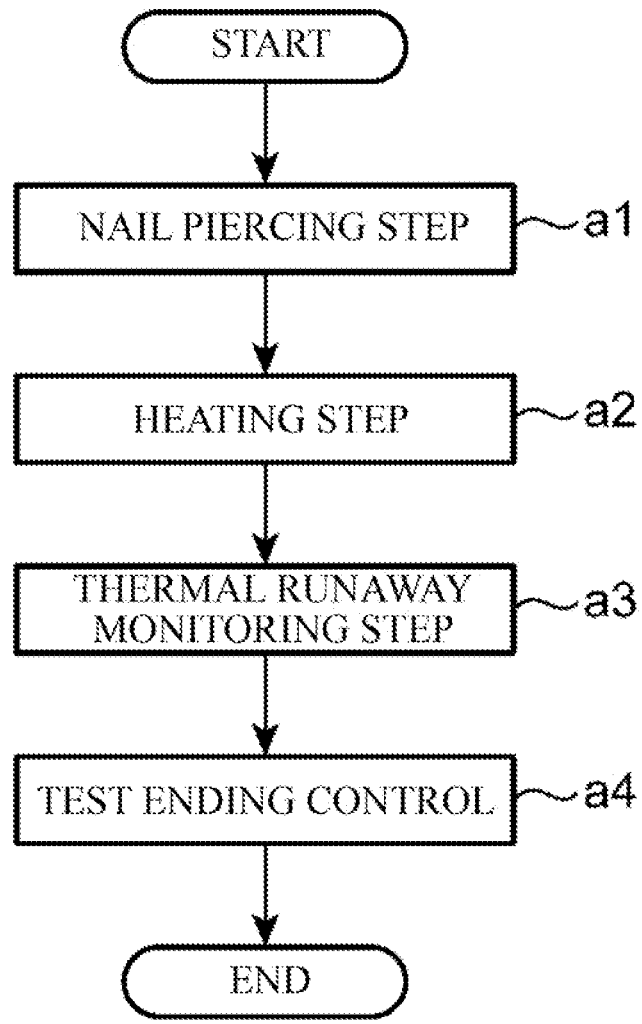
FIG. 17 is a flowchart showing a first test method using a test device.

FIG. 17 is a flowchart showing a first test method using the test device E1. In a state where the nail portion 11 of the test jig 1 is supported by the support member 2, when the battery pack LB is set at a predetermined position facing the tip end portion 113 of the nail portion 11 and a start button is pressed, a control of the controller 5 is started. When the control of the controller 5 is started, a test for evaluating safety of the battery pack LB is started. In a test period from the start of the test to the end of the test, a surface temperature of one unit battery LB2 to be tested among the plurality of unit butteries LB2 constituting the battery pack LB is detected by the temperature sensor TS, and the detection result is input into the controller 5.

First, the controller 5 controls the actuator 4 to execute a nail piercing control to move the support member 2 so that the nail portion 11 pierces the unit battery LB2 to be tested (Step a1, a nail piercing step). A pseudo internal short circuit occurs in the unit battery LB2 that is pierced by the nail portion 11. When an internal short circuit occurs in the unit battery LB2, heat is generated in the internal short circuit portion of the unit battery LB2.

Next, the controller 5 controls the temperature raising adjuster 31 to execute a heating control to adjust the electric power supplied to the heater 12 via the pair of conductive wires 121 and raise the temperature of the nail portion 11 by the heater 12 (step a2, a heating step).

After the nail piercing control and the heating control are executed, the controller 5 executes a thermal runaway monitoring control for determining whether the unit battery LB2 reached thermal runaway based on the detection result of the temperature sensor TS (step a3, a thermal runaway monitoring step). When the detection result of the temperature sensor TS is a result indicating a rapid temperature raise of the unit battery LB2, the controller 5 determines that the unit battery LB2 reached thermal runaway. On the other hand, when there is no rapid temperature raise of the unit battery LB2, the controller 5 determines that the unit battery LB2 does not reach thermal runaway. In this case, the controller 5 controls the temperature raising adjuster 31 to increase the electric power supplied to the heater 12 via the pair of conductive wires 121. Accordingly, an amount of heat generated by the heater 12 is increased, and the heating of the nail portion 11 by the heater 12 can be strengthened. Therefore, it is likely to cause thermal runaway of the unit battery LB2.

When a predetermined lime elapses after the unit battery LB2 reaches thermal runaway, the controller 5 executes a test ending control (Step a4). In the test ending control, the controller 5 controls the actuator 4 to move the support member 2 such that the nail portion 11 that pierced the unit battery LB2 is separated from the unit battery LB2. Further, the controller 5 controls the temperature raising adjuster 31 to stop the supply of electric power to the heater 12 via the pair of conductive wires 121.

After the test ending control is executed by the controller 5, an operator visually checks whether unit batteries other than the unit battery LB2 to be tested catch fire. A second temperature sensor may be attached in advance to a unit battery adjacent to the unit battery LB2 to be tested. In this case, it is possible to confirm whether the unit battery to which the second temperature sensor is attached catches fire based on a detection result of the second temperature sensor.

As described above, in the first test method, the nail portion 11 pierces the unit battery LB2 to be tested to cause an internal short circuit, and then the temperature of the nail portion 11 that pierced the unit battery LB2 is raised by the heater 12. Accordingly, it is possible to efficiently cause thermal runaway of the unit battery LB2.

Although a test method in which the controller 5 executes the heating control after the nail piercing control has been described above, the present invention is not limited thereto. For example, in the first test method, the controller 5 may be configured to execute the nail piercing control and the heating control. That is, the controller 5 simultaneously executes the nail piercing control and the heating control. In this case, the nail portion 11 can pierce the unit battery LB2 to be tested to cause an internal short circuit, and the temperature of the nail portion 11 that pierced the unit battery LB2 car be raised by the heater 12.

In the first test method, the controller 5 may omit the thermal runaway monitoring control. In this case, the controller 5 executes the heating control after the nail piercing control, or executes the heating control together with the nail piercing control. Then, the controller 5 executes the test ending control when a predetermined time elapses after the temperature of the nail portion 11 that pierced the unit battery LB2 to be tested is raised by the heater 12.

Second Test Method

Figure 18:
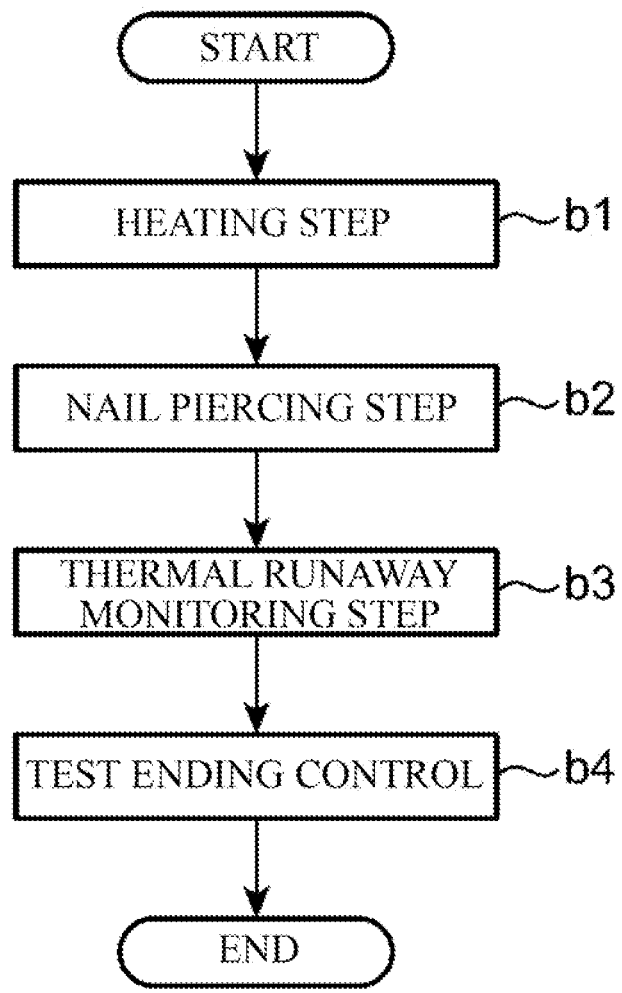
FIG. 18 is a flowchart showing a second test method using a test device.

FIG. 18 is a flowchart showing a second test method using the test device E1. In the second test method, when the start button is pressed, the controller 5 controls the temperature raising adjuster 31 to execute a heating control to adjust the electric power supplied to the heater 12 via the pair of conductive wires 121 and raise the temperature of the nail portion 11 by the heater 12 (step b1, a heating step).

Next, the controller 5 controls the actuator 4 to execute a nail piercing control to move the support member 2 such that the nail portion 11 pierces the unit battery LB2 to be tested (step b2, a nail piercing step). A pseudo internal short circuit occurs in the unit battery LB2 that is pierced by the nail portion 11.

After the heating control and the nail piercing control are executed, the controller 5 executes a thermal runaway monitoring control in a similar manner to that in the first test method (step b3, a thermal runaway monitoring step), and then executes a test ending control (step b4).

As described above, in the second test method, the nail portion 11 whose temperature is raised in advance by the heater 12 pierces the unit battery LB2 to be tested to cause an internal short circuit. Accordingly, the unit battery LB2 can be quickly heated by the heat transferred from the nail portion 11 whose temperature is raised in advance. Therefore, it is possible to efficiently cause thermal runaway of the unit battery LB2.

Although a test method in which the controller 5 executes the nail piercing control after the heating control has been described above, the present invention is not limited thereto. For example, in the second test method, the controller 5 may be configured to execute the nail piercing control together with the heating control. That is, the controller 5 simultaneously executes the heating control and the nail piercing control. In this case, the temperature of the nail portion 11 can be raised by the heater 12, and the nail portion 11 can pierce the unit battery LB2 to be tested to cause an internal short circuit.

In the second test method, the controller 5 may omit the thermal runaway monitoring control. In this case, the controller 5 executes the nail piercing control after the heating control, or executes the nail piercing control together with the heating control. Then, when a predetermined time elapses after the nail portion 11 whose temperature is raised by the heater 12 pierces the unit battery LB2 to be tested, the controller 5 executes the test ending control.

Third Test Method

Figure 19:
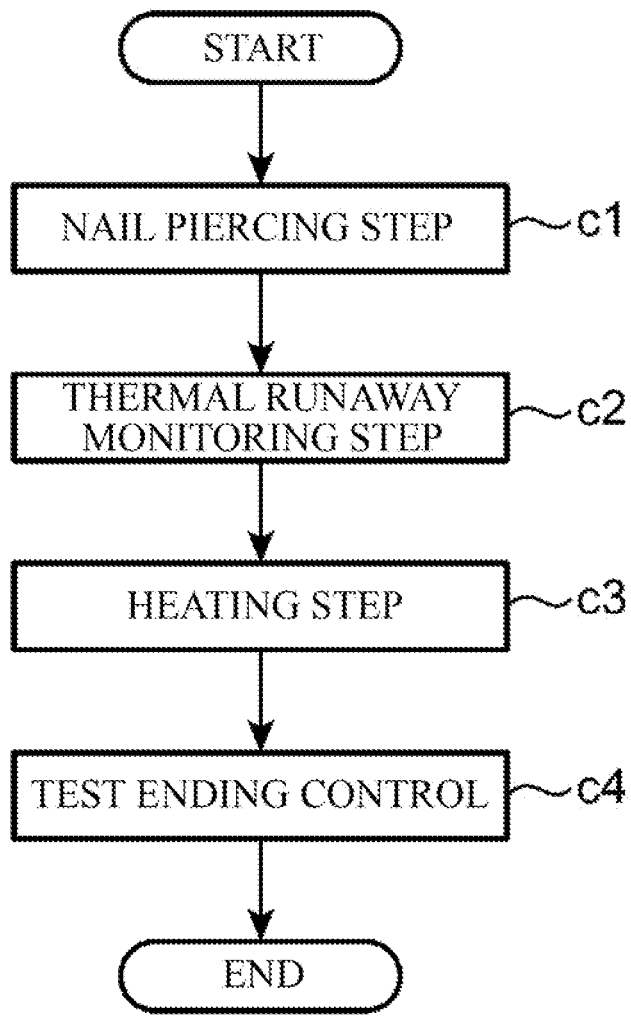
FIG. 19 is a flowchart showing a third test method using a test device.

FIG. 19 is a flowchart showing a third test method using the test device E1. In the third test method, when the start button is pressed, the controller 5 controls the actuator 4 to execute a nail piercing control to move the support member 2 such that the nail portion 11 pierces the unit battery LB2 to be tested (step c1, a nail piercing step). A pseudo internal short circuit occurs in the unit battery LB2 that is pierced by the nail portion 11.

Next, based on a detection result of the temperature sensor TS, the controller 5 executes a thermal runaway monitoring control for determining whether the unit battery LB2 reached thermal runaway in accordance with the internal short circuit caused by the piercing of the nail portion 11 (step c2, a thermal runaway monitoring step).

When the controller 5 determines that the thermal runaway of the unit battery LB2 does not occur within a predetermined time after the nail portion 11 pierces the unit battery LB2, the controller 5 executes the heating control (step c3, a heating step). In the heating control, the controller 5 controls the temperature raising adjuster 31 to adjust the electric power supplied to the heater 12 via the pair of conductive wires 121 and raise the temperature of the nail portion 11 by the heater 12. Then, when a predetermined time elapses alter the unit battery LB2 reaches thermal runaway, the controller 5 executes the test ending control (step c4).

In the thermal runaway monitoring control (step c2), the controller 5 may be configured to execute the test ending control (step c4) while omitting the heating control (step c3) when it is determined that the thermal runaway occurred in the unit battery LB2 in accordance with the piercing of the nail portion 11.

As described above, in the third test method, in a state where an internal short circuit occurs in the unit battery LB2 due to the piercing of the nail portion 11, when the unit battery LB2 does not reach thermal runaway, the unit battery LB2 can be heated by the heat transferred from the nail portion 11 whose temperature is raised by the heater 12. Accordingly, thermal runaway of the unit battery LB2 can be induced.

Although the test jig, the test device, and the test method for a secondary battery according to embodiments of the present invention have been described above, the present invention is not limited thereto, and for example, the following modified embodiments can be adopted.

Although the test jig, the test device and the test method in a case where a battery pack is to be tested have been described in the embodiments described above, the present invention is not limited thereto. The present invention is also applied to a case where one secondary battery is to be tested.

Although a configuration in which the measuring instrument 6 converts a thermoelectromotive force indicated by a thermoelectromotive force signal output from the thermocouple wire 141 into a temperature has been described in the fourth to sixth embodiments described above, the present invention is not limited to such a configuration. For example, the controller 5 may have a functional configuration for converting a thermoelectromotive force into a temperature. In this case, the measuring instrument 6 is omitted, and the thermoelectromotive force signal output from the thermocouple wire 141 is directly input into the controller 5. The controller 5 converts the thermoelectromotive force indicated by the input thermoelectromotive force signal into a temperature.

Although a temperature detector that detects the temperature of the nail portion 11 is configured by the thermocouple 14 in the fourth to sixth embodiments described above, the temperature detector is not limited to the thermocouple 14.

For example, the temperature detector may be configured by a thermistor, a resistance temperature detector, or the like.

Although a configuration in which the thermocouple 14 that configures the temperature detector is built in the nail portion 11 has been described in the fourth to sixth embodiments described above, the present invention is not limited to such a configuration. For example, the temperature detector may be attached to the outer peripheral surface of the nail portion 11. In this case, the temperature detector is disposed on the outer peripheral surface of the nail portion 11 at a position where the nail portion 11 does not come into contact with the unit battery LB2 in a state where the nail portion 11 pierces the unit battery LB2.

As described above, a test jig for a secondary battery according to one aspect of the present invention includes: a nail portion configured to pierce the secondary battery; and a heater configured to raise a temperature of the nail portion by being supplied with electric power.

According to this test jig, the temperature of the nail portion that pierces the secondary battery and comes into contact with the inner side of the secondary battery can be raised by the heater. Therefore, the heat of the nail portion can be directly transferred to the inner side of the secondary battery by a heat transfer from the nail portion whose temperature is raised by the heater, and the inner side of the secondary battery can be forcibly heated. In a case where an internal short circuit occurs in the secondary battery due to the piercing of the nail portion and heat is generated, the inner side of the secondary battery can be forcibly heated by the heat transferred from the nail portion whose temperature is raised by the heater in addition to the generated heat. Accordingly, when safely is evaluated by forcibly causing thermal runaway of the secondary battery, it is possible to efficiently cause thermal runaway.

In the above test jig, the heater may be built in the nail portion.

In this aspect, since the heater is built in the nail portion, the heat generated by the heater can be efficiently transferred to the nail portion without being dissipated to the outside. Therefore, the heater can effectively raise the temperature of the nail portion. Accordingly, forcibly heating the inner side of the secondary battery can be effectively performed accompanying with the heat transfer from the rail portion. Since the heater is built in the nail portion, it is possible to prevent the heater from coming into contact with the secondary battery.

In the above test jig, the heater may be attached to an outer peripheral surface of the nail portion.

In this aspect, since the heater is attached to the outer peripheral surface of the nail portion, it is possible to efficiently raise the temperature of the outer peripheral surface of the nail portion that is in contact with the inner side of the secondary battery in a state where the nail portion pierces the secondary battery. Therefore, forcibly heating the inner side of the secondary battery can be effectively performed accompanying with the heat transfer from the nail portion. The nail portion can be reduced in size by attaching the heater to the outer peripheral surface of the nail portion.

The above test jig may further include a temperature detector configured to detect the temperature of the nail portion.

In this aspect, the temperature of the nail portion whose temperature is raised by the heater can be detected based on a temperature measurement result of the temperature detector.

A test device for a secondary battery according to other aspect of the present invention includes: the above test jig; and a moving mechanism configured to move the nail portion toward the secondary battery.

Further, a test device for a secondary battery includes: the above test jig; a support member configured to support the nail portion, and a moving mechanism configured to cause a movement of the nail portion toward the secondary battery in accordance with a movement of the support member by moving the support member. The heater is configured to raise the temperature of the nail portion via the support member.

According 10 this test device, the nail portion pierces the secondary battery accompanying with a movement conducted by the moving mechanism. At this time, the inner side of the secondary battery can be forcibly heated by the heat transferred from the nail portion whose temperature is raised by the heater to the inner side of the secondary battery. Accordingly, when safety is evaluated by forcibly causing thermal runaway of the secondary battery using the test device, it is possible to efficiently cause thermal runaway.

A test method for a secondary battery according to other aspect of the present invention includes: a heating step of raising a temperature of a nail portion by a heater; and a nail piercing step of piercing the nail portion into the secondary battery.

According to this test method, the temperature of the nail portion that pierces the secondary battery and comes into contact with the inner side of the secondary battery in the nail piercing step can be raised by the heater in the heating step. Therefore, the heat of the nail portion can be directly transferred to the inner side of the secondary battery by a heat transfer from the nail portion whose temperature is raised by the heater, and the inner side of the secondary battery can be forcibly heated. In a case where an internal short circuit occurs in the secondary battery due to the piercing of the nail portion and heat is generated, the inner side of the secondary battery can be forcibly heated by the heat transferred from the nail portion whose temperature is raised by the heater in addition to the generated heat. Accordingly, in the test method for evaluating safety by forcibly causing thermal runaway of the secondary battery, it is possible to efficiently cause thermal runaway of the secondary battery.

In the above test method, the heating step may be executed after the nail piercing step.

In this aspect, the nail portion pierces the secondary battery in the nail piercing step, and then the inner side of the secondary battery can be forcibly heated by the heat transferred from the nail portion whose temperature is raised in the heating step. Accordingly, when safety is evaluated by forcibly causing thermal runaway of the secondary battery, it is possible to efficiently cause thermal runaway.

The above test method may further include a thermal runaway monitoring step of monitoring thermal runaway of the secondary battery in accordance with an internal short circuit caused by piercing of the nail portion after the nail piercing step. The heating step may be executed when it is determined in the thermal runaway monitoring step that the thermal runaway of the secondary battery does not occur within a predetermined time.

In this aspect, in a state where an internal short circuit occurs in the secondary battery due to the piercing of the nail portion, when the secondary battery does not reach thermal runaway, the secondary battery can be heated by the heat transferred from the nail portion whose temperature is raised in the heating step. Accordingly, thermal runaway of the secondary battery can be induced.

In the above test method, the nail piercing step may be executed after the heating step.

In this aspect, the nail portion whose temperature is raised in advance in the heating step pierces the secondary battery in the nail piercing step, and the secondary battery is heated from the inner side. Therefore, the secondly battery can be rapidly heated by the heat transferred from the nail portion whose temperature is raised in advance. Accordingly, when safety is evaluated by forcibly causing thermal runaway of the secondary battery, it is possible to efficiently cause thermal runaway.

As described above, according to the present invention, it is possible to provide a test jig, a test device, and a test method for a secondary battery that can efficiently cause thermal runaway when safety of the secondary battery is evaluated.

What is claimed is:

1. A test jig for a secondary battery, the test jig comprising: a nail portion configured to pierce the secondary battery;
a heater configured to raise a temperature of the nail portion by being supplied with electric power; and
a controller configured to execute a thermal runaway monitoring control for monitoring thermal runaway of the secondary battery based on a temperature detection result indicating that an internal short circuit has been caused by piercing of the nail portion,
wherein the heater is built in the nail portion or the heater is attached to an outer peripheral surface of the nail portion.

2. The test jig according to claim 1,
wherein the heater is built in the nail portion.

3. The test jig according to claim 1,
wherein the heater is attached to the outer peripheral surface of the nail portion.

4. The test jig according to claim 1, further comprising:
a temperature detector configured to detect the temperature of the nail portion; wherein the temperature of the nail portion is the temperature detection result.

5. A test device for a secondary battery, the test device comprising:
the test jig according to claim 1; and
a moving mechanism configured to move the nail portion toward the secondary battery.

6. The test jig according to claim 1,
wherein the heater comprises a resistance heating element that generates heat when supplied with electric power.

7. The test jig according to claim 1, wherein the controller is configured to control the heater based on a result of the thermal runaway monitoring control.

8. The test jig according to claim 1, wherein a thermocouple wire is disposed separated from the heater in a bottomed hole of the nail portion filled with inorganic insulating material.

9. A test device for a secondary battery, the test device comprising:
a test jig comprising a nail portion configured to pierce the secondary battery;
a heater configured to raise a temperature of the nail portion by being supplied with electric power;
a support member configured to support the nail portion; and
a moving mechanism configured to cause a movement of the nail portion toward the secondary battery in accordance with a movement of the support member by moving the support member,
wherein the heater is configured to raise the temperature of the nail portion via the support member.

10. The test device according to claim 9, wherein the heater is controlled to raise the temperature of the nail portion via the support member based on a result of thermal runaway monitoring of the secondary battery in accordance with an internal short circuit caused by the piercing of the nail portion.

11. A test method for a secondary battery, the test method comprising:
a heating step of raising a temperature of a nail portion by a heater;
a nail piercing step of piercing the nail portion into the secondary battery; and
a thermal runaway monitoring step of monitoring thermal runaway of the secondary battery in accordance with an internal short circuit caused by piercing of the nail portion after the nail piercing step,
wherein the heater is built in the nail portion, the heater is attached to an outer peripheral surface of the nail portion, or the heater is attached to a support member configured to support the nail portion.

12. The test method according to claim 11,
wherein the heating step is executed after the nail piercing step.

13. The test method according to claim 12, wherein the heating step is executed when it is determined in the thermal runaway monitoring step that the thermal runaway of the secondary battery does not occur within a predetermined time.

14. The test method according to claim 11,
wherein the nail piercing step is executed after the heating step.

15. The test method according to claim 11,
wherein the heater comprises a resistance heating element that generates heat when supplied with electric power.

16. The test method according to claim 11, further comprising controlling the heater based on a result of the thermal runaway monitoring.

17. The test method according to claim 11, wherein a thermocouple wire is disposed separated from the heater in a bottomed hole of the nail portion filled with inorganic insulating material.

* * * * *